(12) United States Patent
Kim (10) Patent No.: US 6,643,205 B2
(45) Date of Patent: Nov. 4, 2003

(54) APPARATUS AND METHOD FOR REFRESH AND DATA INPUT DEVICE IN SRAM HAVING STORAGE CAPACITOR CELL

(75) Inventor: Tae Hoon Kim, Seocho-Gu (KR)

(73) Assignee: Coremagic, Inc., Gyeonggi-Do (KR)

( * ) Notice: Subject to any disclaimer, the term of this patent is extended or adjusted under 35 U.S.C. 154(b) by 0 days.

(21) Appl. No.: 10/093,149

(22) Filed: Mar. 7, 2002

(65) Prior Publication Data

US 2003/0076727 A1 Apr. 24, 2003

(30) Foreign Application Priority Data

Oct. 23, 2001 (KR) ........................................ 2001-65512
Oct. 23, 2001 (KR) ........................................ 2001-65516

(51) Int. Cl.[7] ................................................ G11C 7/00
(52) U.S. Cl. ........................................ 365/222; 365/233
(58) Field of Search ................................. 365/222, 233

(56) References Cited

U.S. PATENT DOCUMENTS 5,295,109 A * 3/1994 Nawaki ....................... 365/222
6,415,353 B1 * 7/2002 Leung ......................... 365/222
2002/0056022 A1 * 5/2002 Leung ......................... 711/106

* cited by examiner

Primary Examiner—Son Mai
(74) Attorney, Agent, or Firm—Harness, Dickey & Pierce, P.L.C.

(57) ABSTRACT

An apparatus for a refresh and a data input device in the SRAM having a storage capacitor cell comprises an internal clock generator for generating and outputting two internal clock signals having a certain time difference of each other, a refresh timer for generating and outputting an output signal to notify a refresh time, a refresh signal generator for generating a refresh signal in response to a faster signal of the two internal signals and the output signal from the refresh timer, a refresh counter for generating refresh addresses during the refresh and a column path controller for controlling the activation of a column path in response to a row active signal and the refresh signal.

17 Claims, 13 Drawing Sheets

FIG. 15

APPARATUS AND METHOD FOR REFRESH AND DATA INPUT DEVICE IN SRAM HAVING STORAGE CAPACITOR CELL

FIELD OF THE INVENTION

The present invention relates to an apparatus and method for the peripheral devices of the SRAM; and, more particularly, to an apparatus and method for the refresh and the data input device in the SRAM having storage capacitor cell.

BACKGROUND OF THE INVENTION

Generally, the dynamic random access memory (DRAM) is widely known as a semiconductor memory device having a memory cell with the capacitor. Since the DRAM includes one access transistor and one capacitor, the DRAM is advantageous in high integration. However, in order to maintain the data stored in the cell, the refresh is required periodically in the DRAM. On the other hand, although the refresh is not required in the static RAM(SRAM) because it operates in a latch type, however, it has disadvantage that the integration is not high as the DRAM because a unit cell has to include the a plurality of transistors.

The pseudo SRAM and the virtual SRAM are widely known for the devices having the advantages of both DRAM and SRAM devices. Although a capacitor is used to store data in a cell, the refresh is concealed easily in both the pseudo SRAM and the virtual SRAM.

On the other hands, when logic 'low' is applied to a pad/we during the writing operation, the pad/we is transited from 'low' to 'high' and the data is written in the memory cell after the certain period of time tWC in the SRAM. This is opposite to the DRAM, which writes the data to the cell when the write operation is begun by enabling the pad/we to 'low'.

In the SRAM specification, the limitation for the maximum limit of the writing time is not determined. That means, it is unknown when the writing operation is completed after the pad/we is dropped to 'low' and the writing operation is begun. Therefore, in case of the SRAM, the refresh is not operated until the data is written into the cell if the refresh in a refresh timer is in turn after the pad/we becomes 'low'. That is because an address from an internal counter is taken by the refresh and the refresh is operated after that, the address from the internal counter is different from the writing address. Furthermore, if the pad/we is transited from 'low' to 'high' during the refresh, the active address cell is written by the refresh.

Moreover, the fail is occurred if the write operation becomes infinitely longer. Also, the maximum time specification cannot be applied to the write operation because it is not compatible with the ordinary SRAM.

SUMMARY OF THE INVENTION

It is, therefore, an object of the present invention to provide an apparatus and method for a refresh and a data input device in SRAM having a storage capacitor cell.

In accordance with an aspect of the present invention, there is provide an apparatus for a refresh and a data input device in the SRAM having a storage capacitor cell, comprising: an internal clock generating means for generating and outputting two internal clock signals having a certain time difference of each other; a refresh timer for generating and outputting an output signal to notify a refresh time; a refresh signal generating means for generating a refresh signal in response to a faster signal of the two internal signals and the output signal from the refresh timer; a refresh counter for generating refresh addresses during the refresh; and a column path control means for controlling the activation of a column path in response to a row active signal and the refresh signal.

In accordance with another aspect of the present invention, there is provide a method for the refresh and the data input device in the SRAM having a storage capacitor cell, comprising the steps of: a) generating two internal clocks having a certain time difference of each other; b) using a delayed signal of the two internal clocks as a strobe signal of an address; c) inputting an output signal from a refresh timer and generating a refresh signal in response to the faster signal of the two internal clocks; and d) selecting one of addresses, which are an external address and an internal address, for using a refresh signal.

In accordance with further another aspect of the present invention, there is provide a method for the refresh and the data input device in the SRAM having a storage capacitor cell, comprising the steps of: a) disabling an address when the refresh signal is enabled during a write operation; b) confirming a current state if it is the write operation when the refresh begins; c) generating a delay signal for notifying the refresh if it is the write operation after the step b); d) generating a write address and a latch signal of the data when the delay signal is generated; e) controlling an external input path of an address buffer using the write latch signal; f) latching an external address after the step e); and g) buffering the latched address after the refresh.

In accordance with further another aspect of the present invention, there is provide a method for the refresh and the data input device in the SRAM having a storage capacitor cell, comprising the steps of: a) disabling an address when the refresh signal is enabled during a write operation; b) confirming the current state if it is the write operation when the refresh begins; c) generating a delay signal for notifying the refresh if it is the write operation after the step b); d) generating a write address and a latch signal of the data when the delay signal is generated; e) controlling a write driver using the write latch signal; f) latching an external address after the step e); and g) buffering the latched address after the refresh.

In accordance with further another aspect of the present invention, there is provide a method for the refresh and the data input device in the SRAM having a storage capacitor cell, comprising the steps of: a) disabling an address when the refresh signal is enabled during a write operation; b) confirming the current state if it is the write operation, when the refresh begins; c) generating a delay signal for notifying the refresh if it is the write operation after the step b); d) generating a write address and a latch signal of the data when the delay signal is generated; e) controlling a write driver using the write latch signal; f) latching an external address after the step e); and g) buffering the latched address after the refresh.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
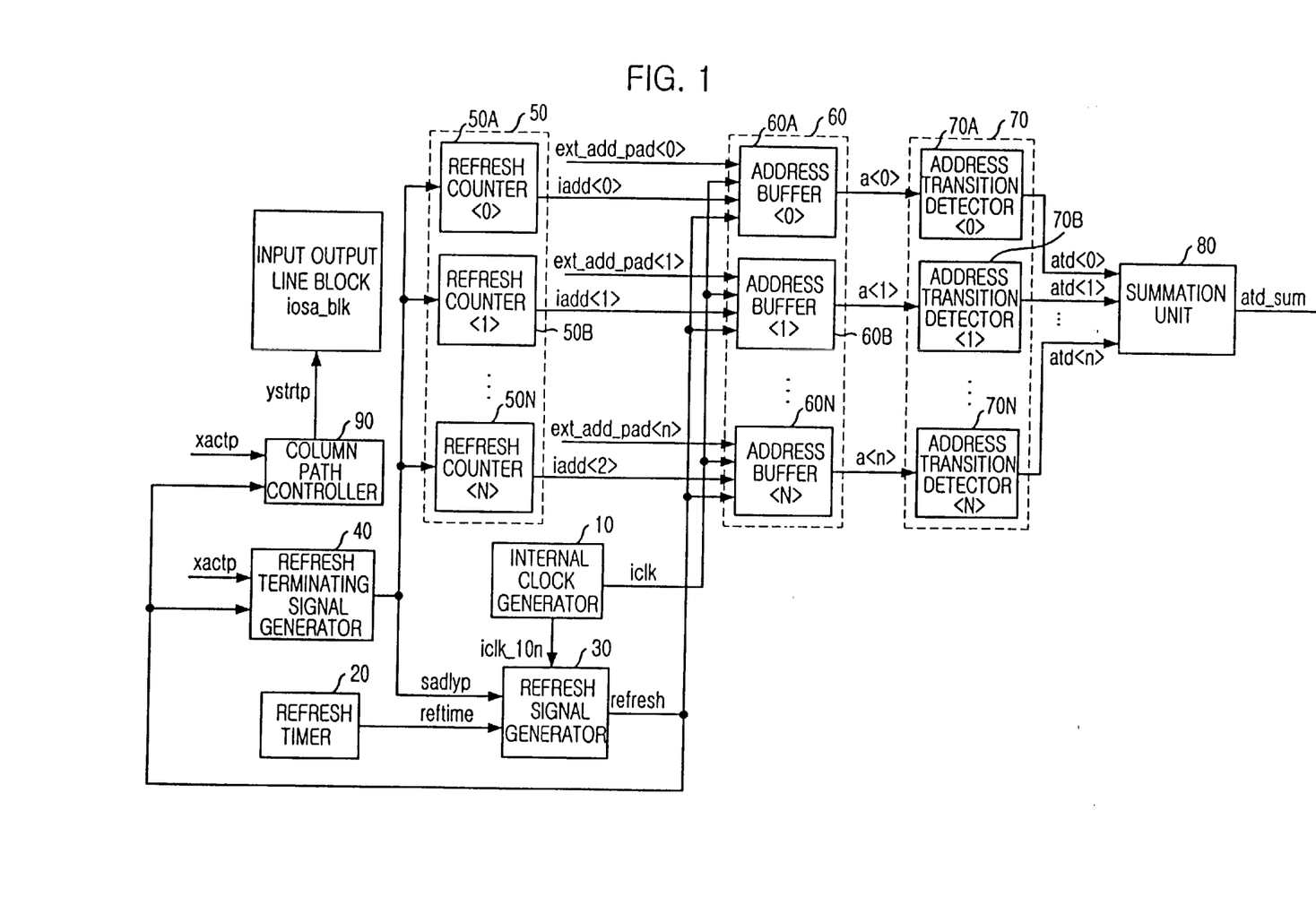
FIG. 1 is a block diagram of the refresh device.

FIG. 1 is a block diagram of the refresh device.

In FIG. 1, the refresh device of the present invention includes an internal clock generator 10 for generating and outputting two internal clock signals iclk-10n and iclk having a certain time difference of each other, a refresh timer 20 for generating and outputting an output signal reftime to notify the refresh time, a refresh signal generator 30 for generating the refresh signal refresh in response to the input signal of the internal clock signal iclk-10n in the internal clock generator 10 and the output signal reftime in the refresh timer 20, a refresh terminating signal generator 40 for generating a refresh terminating signal sadlyp in response to the input signal of a row active signal xactp and the refresh signal refresh, a refresh counter 50 for generating the internal addresses iadd<0> through iadd<n> during the refresh, an address buffer 60 for selectively buffering the internal addresses iadd<0> through iaad<n> outputted from the external addresses ext_add_pad<0> through ext_add_pad<n> or the refresh counter 50 synchronized by a clock edge of the internal clock signal iclk, an address transition detector 70 having a plurality of detectors for detecting the transition of an address by inputting the output signals of the address buffer 60, a summation unit 80 for summating the output signals from each detector in the address transition detector 70 and a column path controller 90 for controlling the activation of a column path in response to the input signal of the row active signal xactp and the refresh signal refresh.

In addition, the activation of an input-output line block iosa_blk is determined in response to an output signal ystrtp of the column path controller 90.

Figure 2:
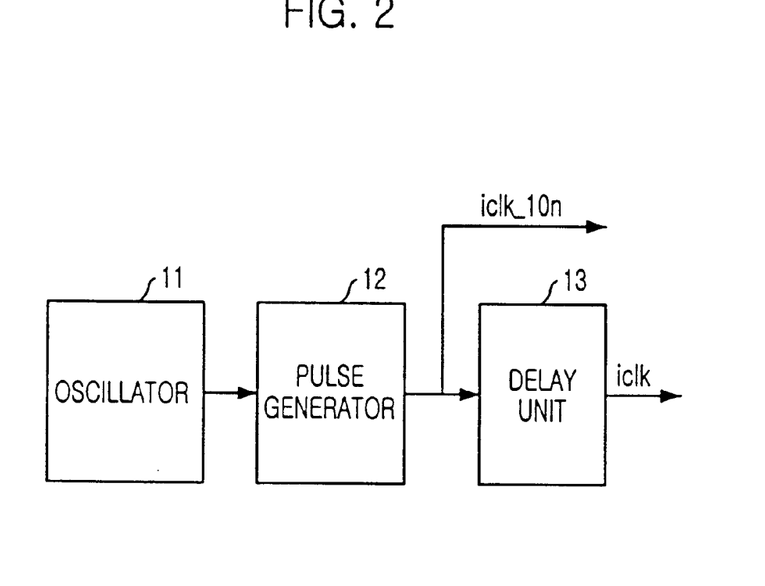
FIG. 2 is a detailed circuit diagram for the internal clock generator 10.

FIG. 2 is a detailed circuit diagram for the internal clock generator 10. In FIG. 2, the internal clock generator includes an oscillator 11 for outputting a signal of the constant period, a pulse generator 12 for generating a faster signal iclk-10n than the internal clock signal iclk in response to the output signal of the oscillator 11 and a delay unit 13 for outputting the internal clock signal iclk by delaying the faster signal iclk-10 for 10 nano seconds. Two internal clock signals have 10 nano seconds difference, however, it can be varied depending on the timing margin or the specification.

Figure 3:
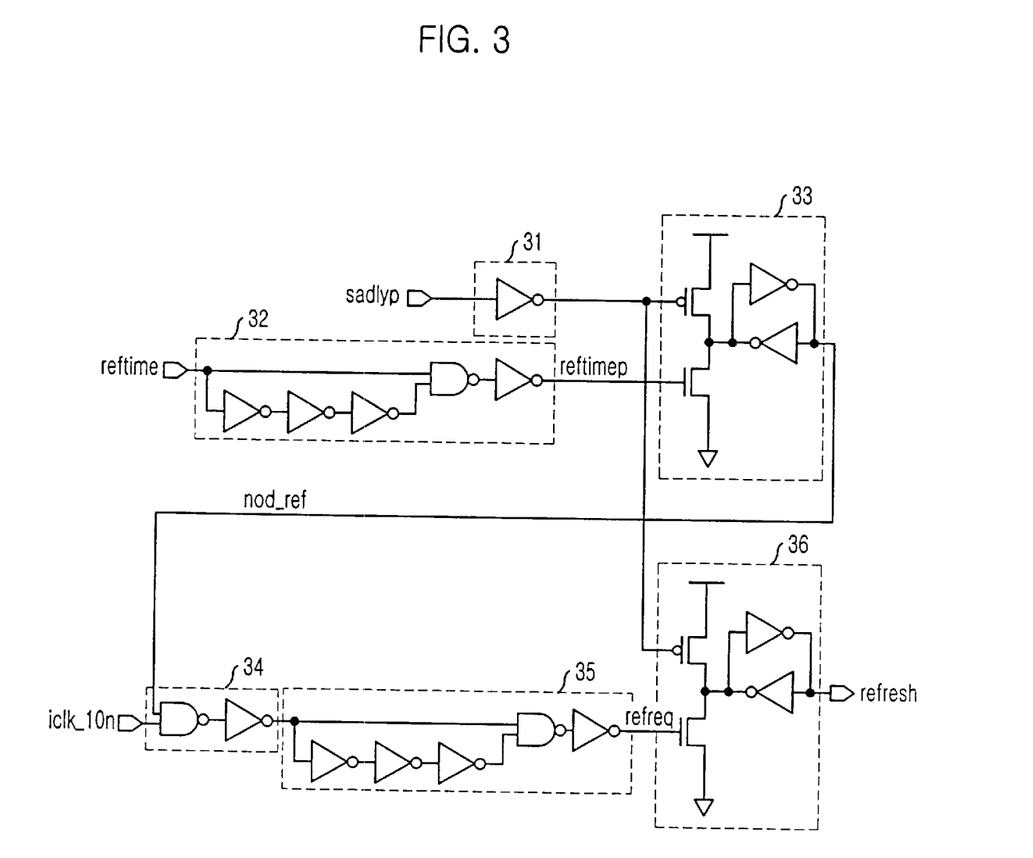
FIG. 3 is a detailed circuit diagram for the refresh signal generator 30.

FIG. 3 is a detailed circuit diagram for the refresh signal generator 30. In FIG. 3, the refresh signal generator 30 includes a refresh terminating signal input unit 31 for inputting the refresh terminating signal sadlyp, a refresh timer signal input unit 32 for inputting the output signal reftime of the refresh timer 20, a refresh drive signal output unit 33 for outputting a refresh drive signal nod_ref in response to the input signal of the refresh terminating signal input unit 31 and the refresh timer signal input unit 32, a decoder 34 for inputting and decoding the refresh drive signal nod_ref and the faster internal clock signal iclk-10n, a refresh request signal generator 35 for generating a refresh request signal refreq by inputting the output signal of the decoder 34 and a refresh signal output unit 36 for outputting the refresh signal refresh in response to the output signal of the refresh request signal generator 35 and the refresh terminating signal input unit 31. The refresh timer signal input unit 32 and the refresh request signal generator 35 are configured as pulse-generating logics.

Figure 4:
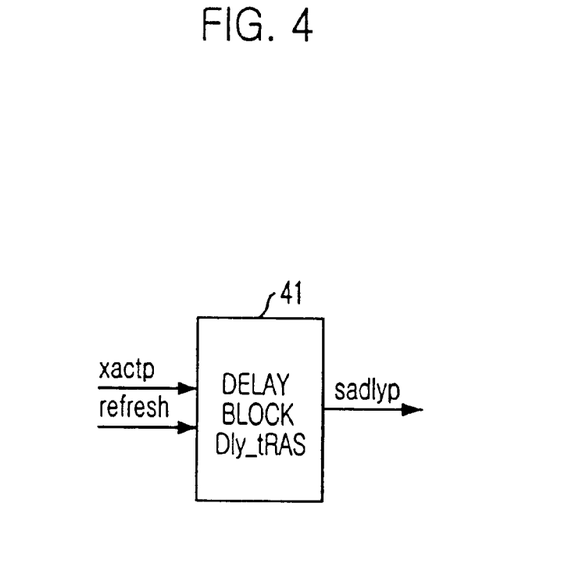
FIG. 4 is a block diagram of the refresh terminating signal generator 40.

FIG. 4 is a block diagram of the refresh terminating signal generator 40. In FIG. 4, the refresh terminating signal generator 40 includes a delay block Dly_tRAS; 41 for outputting the refresh terminating signal sadlyp after delaying the input signals of the row active signal xactp and the refresh signal refresh for a certain period of time.

Figure 5:
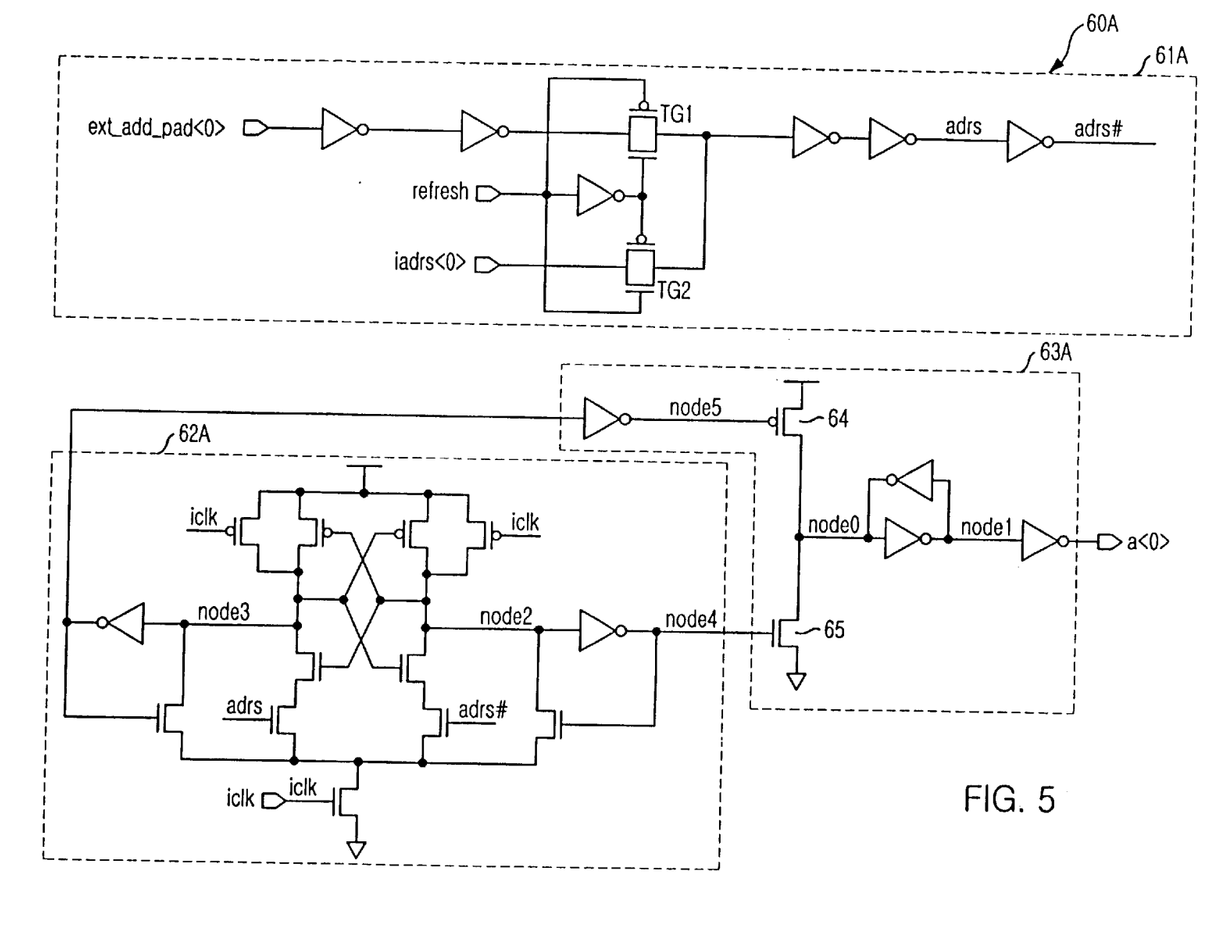
FIG. 5 is a detailed circuit diagram for an address buffer 60A.

FIG. 5 is a detailed circuit diagram for an address buffer 60A. First address buffer 60A through Nth address buffer 60N are under this diagram. In FIG. 5, the address buffer 60A includes an input buffer unit 61A for selectively buffering an internal address iadd0 applied from the refresh counter 50 in response to the control of the refresh signal refresh, a latch unit 62A for latching the buffered input addresses adrs and adrs# by changing the internal clock signal iclk into a strobe signal and an output buffer unit 63A for outputting the output signal of an address a<0> by buffering the output signal of the latch unit 62A. The input buffer unit 61A includes a transmission gate to output an external input address ext_add_pad<0> and the internal address iadd0 selectively and the latch unit 62A includes an ordinary cross couple latch. The output buffer unit 63A includes a pull-up driver 64, a pull-down driver 65 and a output latch.

Figure 6:
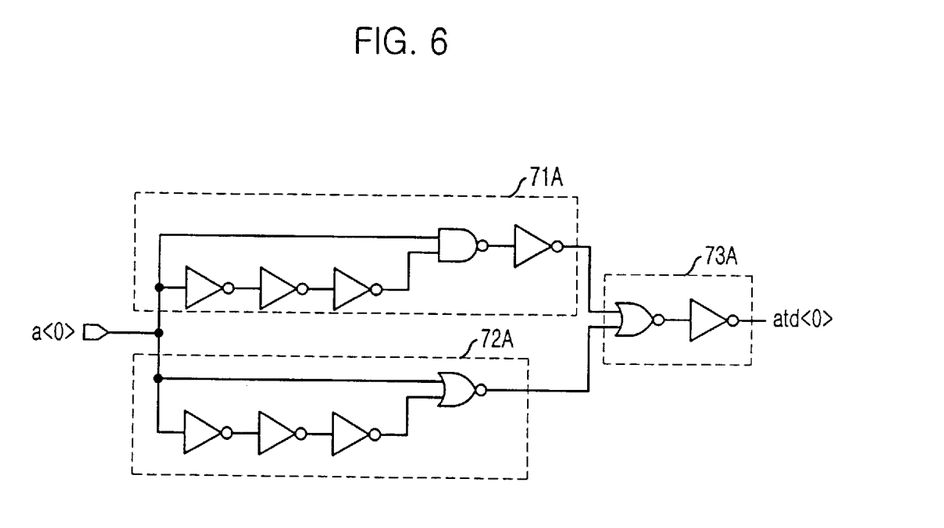
FIG. 6 is a detailed circuit diagram for the address transition detector 70A.

FIG. 6 is a detailed circuit diagram for the address transition detector 70A. In FIG. 6, two parallel connected pulse-generating logics 71A and 72A and an output unit 73A for decoding and outputting the output signals of each of two pulse-generating logics 71A and 72A.

Figure 7:
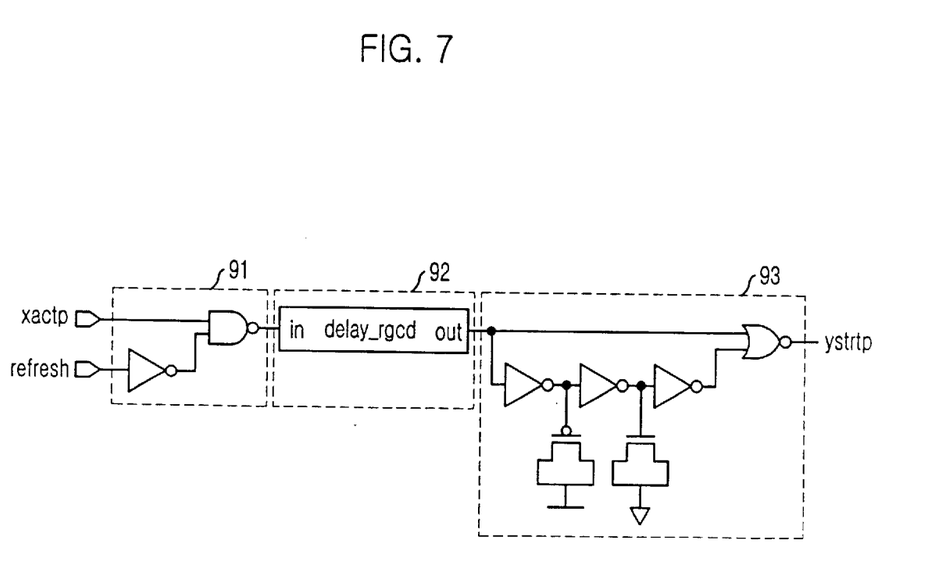
FIG. 7 is a detailed circuit diagram for the column path controller 90.

FIG. 7 is a detailed circuit diagram for the column path controller 90. In FIG. 7, the column path controller 90 includes a decode unit 91 for inputting the row active signal xactp and the refresh signal refresh, a delay unit 92 for delaying the output signal of the decode unit 91 to guarantee tRCD and a output unit 93 for generating the column path control signal ystrtp using the output signal of the delay unit 92. The column path signal output unit 93 is made up of pulse-generating logics.

Figure 8:
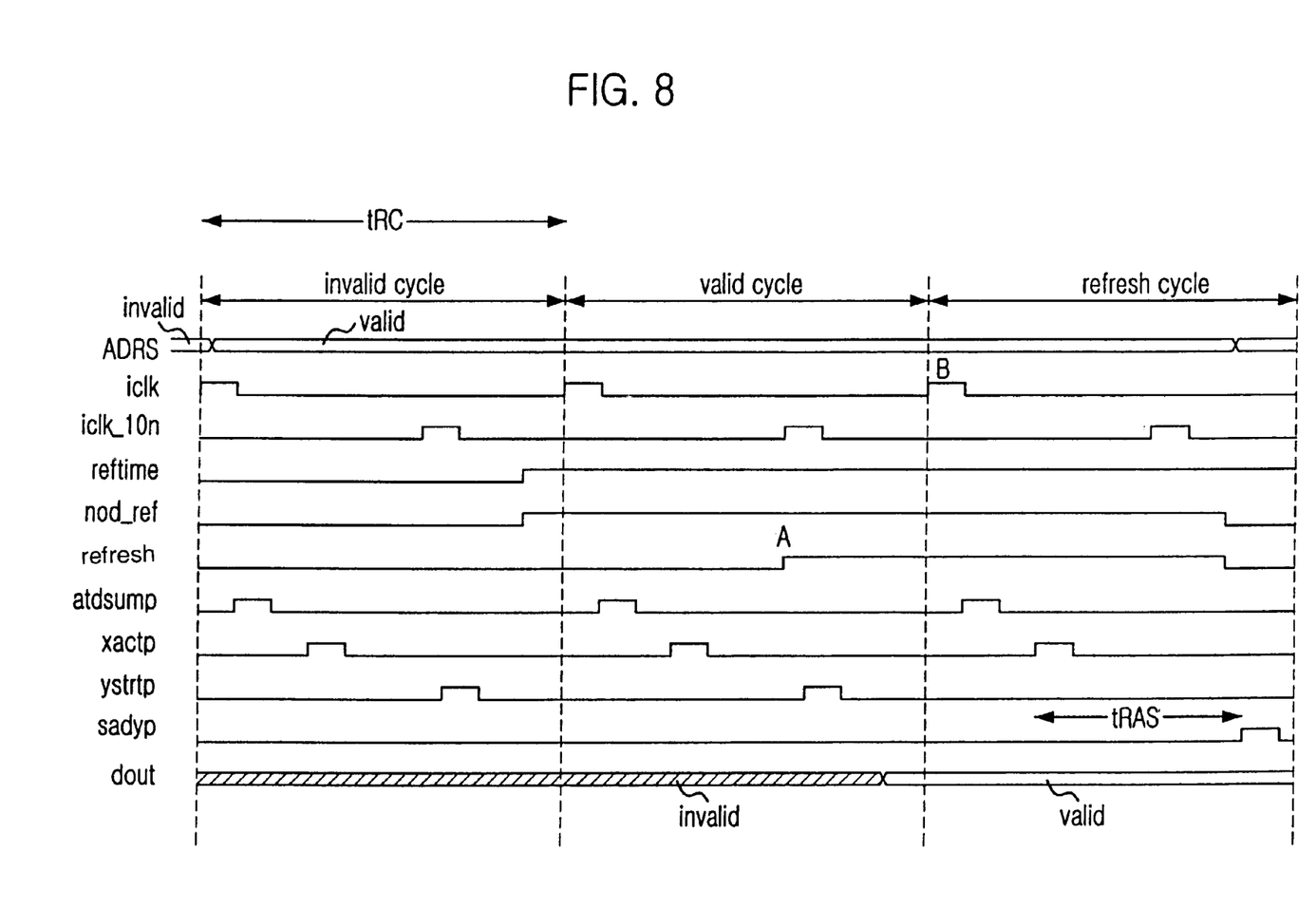
FIG. 8 is a timing chart for the operation of the present invention.

FIG. 8 is a timing chart for the operation of the present invention.

In FIG. 8, the internal clock generator 10 is operated and the internal clock having a constant period is generated when the chip is in the activation state. Two internal clock signals iclk and iclk-10n as shown in FIG. 8 are generated in the activation state and they have a certain time difference of each other. The internal clock signal iclk becomes the strobe signal of the address buffers 60. That is, the addresses in the address buffers 60 are latched when the internal clock signal iclk is transited from logic 'low' to logic 'high' sustained until the internal clock signal iclk is generated. After that, the address buffers 60 receives the addresses again when the next internal clock signal iclk is transited from logic 'low' to logic 'high'.

The refresh timer 20 is for notifying the refresh time and the normal data sustain operation can be done only if the refresh is periodically operated because the cell is made up of one access transistor and one capacitor like the DRAM. Therefore, the refresh timer 20 has a similar structure as an oscillator, which operates in response to the refresh period, and generates the output signal reftime, not synchronized with the internal clock signal iclk.

In the refresh signal generator 30 in FIG. 3, the output signal reftime from the refresh timer 20 is received and synchronized with the internal clock signal iclk-10n and the refresh signal refresh is generated.

In the mean time, if the refresh signal refresh is in the disable state, which is logic 'low', a transmission gate TG1 is switched on (TG2 is off) and the external address inputted from an external address pad is transmitted to the address transition detectors 70A through 70N. If the refresh signal refresh is in the enable state, which is logic 'high', a transmission gate TG2 is switched on (TG1 is off) so that the internal address outputted from the refresh counter 50 is transmitted.

On this occasion, if the refresh signal refresh is in logic 'high', the buffered input addresses adrs and adrs# are determined and latched by the address from the internal refresh counters 50A through 50N because the internal clock signal iclk is delayed for a certain period of time than the internal clock signal iclk-10n.

In FIG. 6, the address transition detector 70A detects the change of the address by receiving the output signal of the address buffer 60A. In the summation unit 80, the output signals ATD from the address transition detectors 70 are summated together to confirm that the change of the entire addresses is occurred and to operate the precharge operation or row active operation x-active.

Therefore, in the refresh method of the present invention, the step of generating two internal clock signals iclk and iclk-10n having a certain time difference of each other is included so that the delayed signal iclk is transformed into the strobe signal and the refresh signal refresh is generated in response to the faster signal iclk-10n. Therefore, one of the internal clock signals is selected for the refresh signal refresh.

The refresh is terminated by the refresh terminating signal generator 40 in FIG. 4. That is, the row active x-active pulse xactp generated during the refresh cycle generates the refresh terminating signal sadlyp after passing the delay block Dly_tRAS; 41. All the refresh operations are terminated by the refresh terminating signal sadlyp.

In the column path controller 90 in FIG. 7, the column path control signal ystrtp is generated to send out the data in the cell to the input output line block iosa_blk. However, if the column path control signal is activated during the refresh cycle, the previous data is lost. Therefore, data is not sent out to the input output line block iosa_blk during the refresh cycle.

In the present invention, the internal clock signal iclk is generated to use as the strobe signal and refresh request signal reftime in the refresh timer 20 is synchronized with the faster clock signal iclk-10n to generate the new refresh signal refresh. By using this refresh to control the switch of the address buffer, the buffered input address can be latched by selecting one of the external or internal addresses when the internal clock signal is transited to 'high' in order to conceal the refresh operation internally.

Hereinafter, another embodiment according to the present invention will be described in detail referring to the accompanying drawings.

Figure 9:
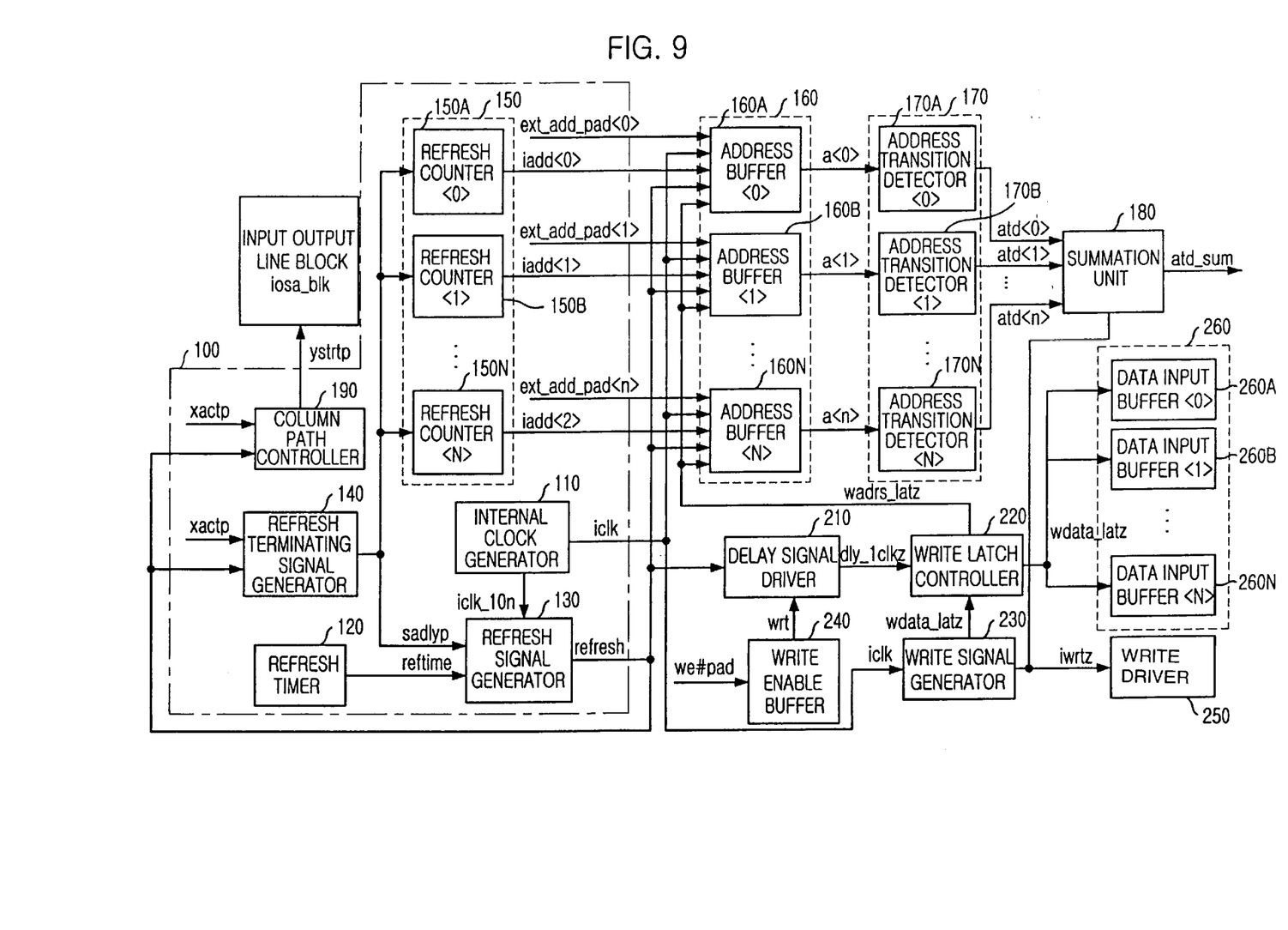
FIG. 9 is a block diagram for the peripherals of the SRAM.

FIG. 9 is a block diagram for the peripherals of the SRAM. In FIG. 9, the peripherals includes a refresh circuit 100 for driving the refresh and other refresh peripherals just the same as FIG. 1 such as address buffers, address transition detectors and a summation unit. The peripherals in FIG. 9 additionally includes a write enable buffer 240 for inputting a write enable signal we#, a delay signal driver 210 for driving a delayed clock signal dly_1clkz by inputting the refresh signal refresh outputted from the refresh circuit 100 and the write enable signal we#, a write latch controller 220 for outputting write latch control signals wadrs_latz and wadta_latz in response to the delayed clock signal dly_lclkz in the delay signal driver 210, a write signal generator 230 for generating a write signal iwrtz controlling a write operation in response to the input signal of the internal clock iclk and a write data latch control signal wdata_latz, a write driver 250 for driving a write data in response to the input signal of the write signal iwrtz and a data input buffer 260A for driving the data input signal in response to the input signal of the write data latch control signal wdata_latz.

Figure 10:
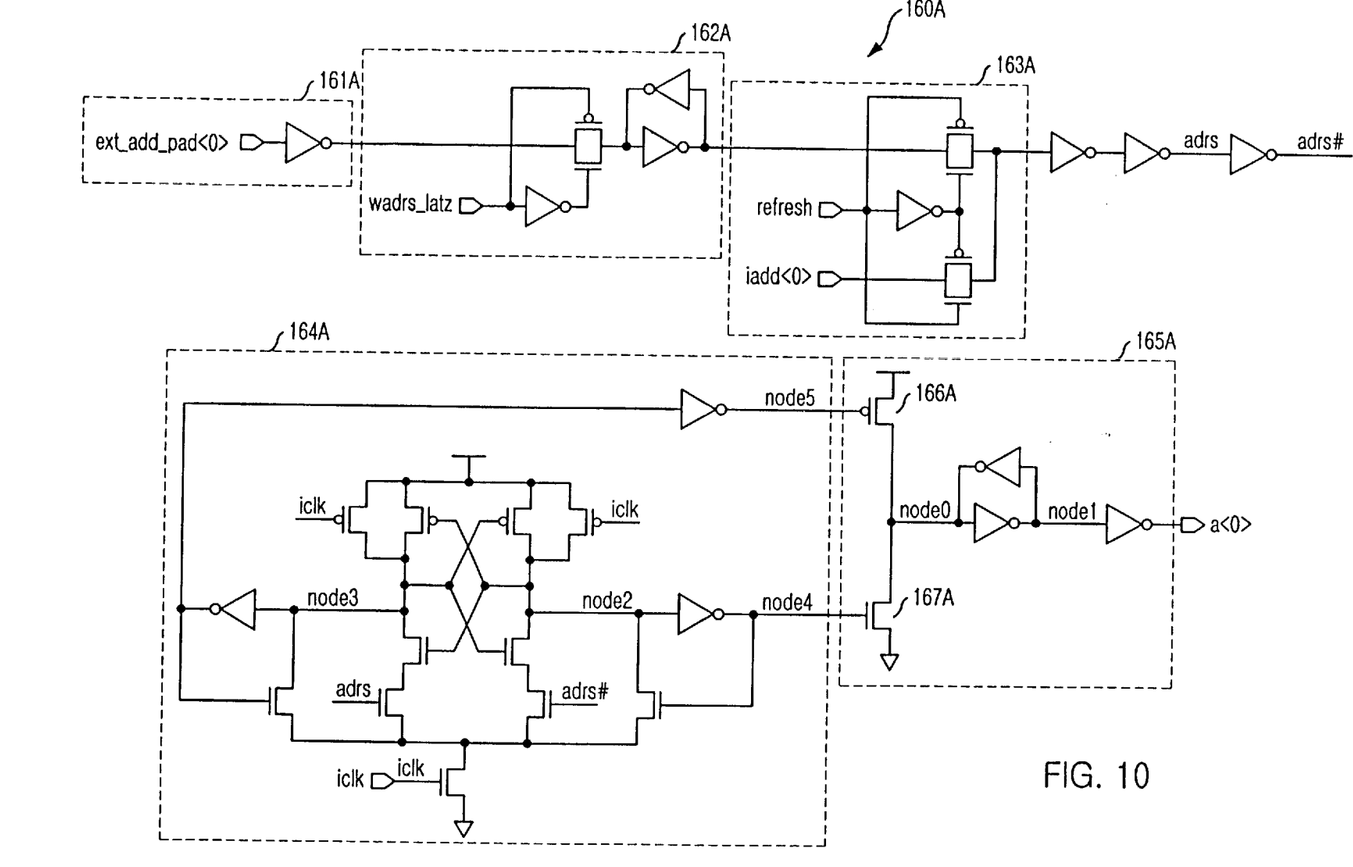
FIG. 10 is a detailed circuit diagram of an address buffer 160A.

FIG. 10 is a detailed circuit diagram of an address buffer 160A. In FIG. 10, the address buffer 160A includes an input unit 161A for receiving an external address ext_add_pad<0> applied from a pad, an external address latch unit 162A for latching and outputting the transmission of the external address ext_add_pad<0> in response to the input signal of the write latch control signal wadrs_latz on the output path of the input unit 161A, an input buffer unit 163A for selectively buffering the external input address ext_add_pad<0> applied from the external address latch unit 162A and the internal address iadd0 applied from a refresh counter 150A in response to the control of the refresh signal refresh, a latch unit 164A for latching the buffered input addresses adrs and adrs# by changing the internal clock signal iclk into the strobe signal and a output buffer unit 165A for outputting the output signal of an address a<0> by buffering the output signal of the latch unit 164A.

Figure 11:
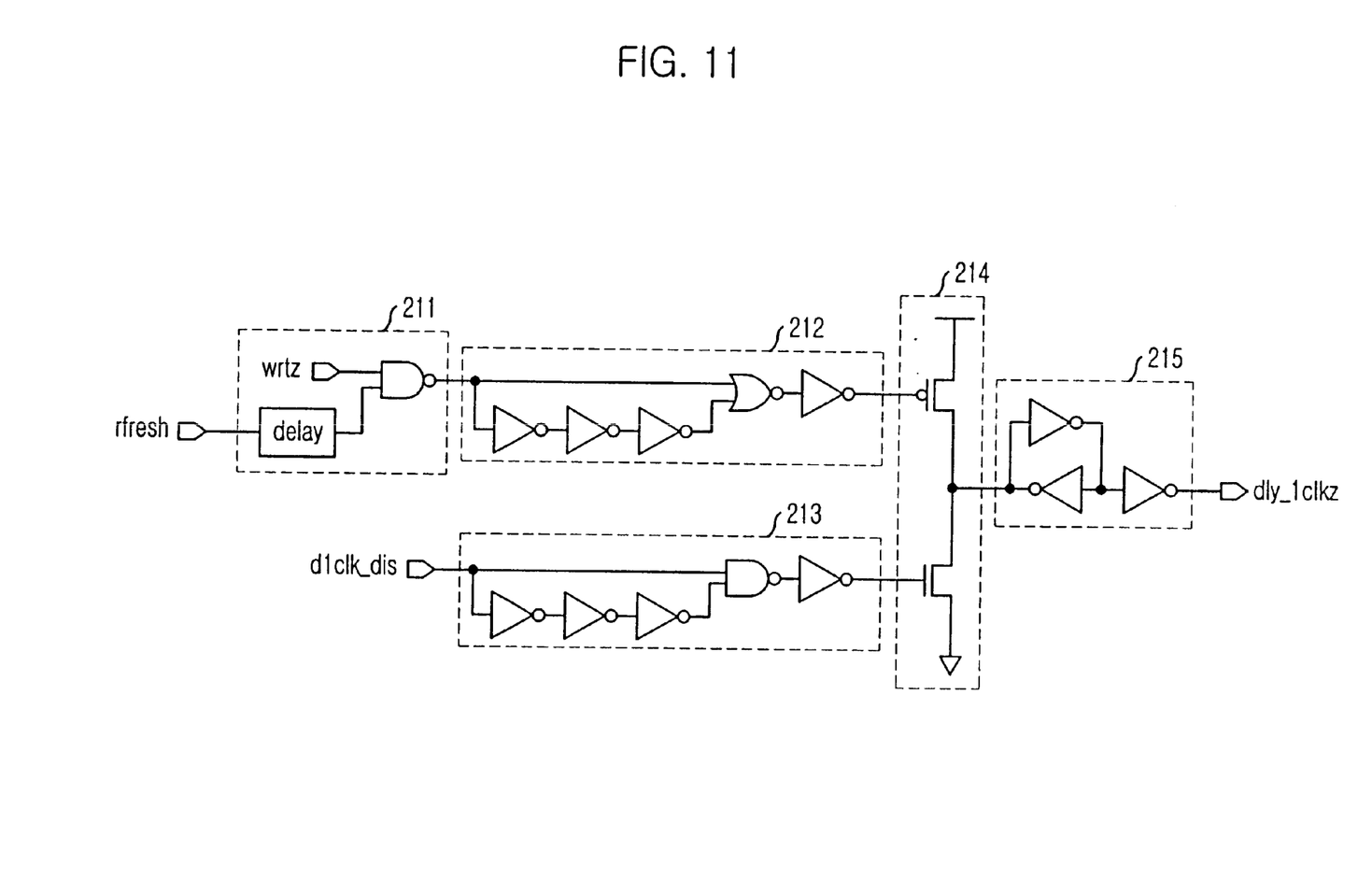
FIG. 11 is a detailed circuit diagram of the delay signal driver 210.

FIG. 11 is a detailed circuit diagram of the delay signal driver 210. In FIG. 11, the delay signal driver 210 includes an input unit for inputting the refresh signal refresh and a write enable buffer signal wrtz, a first pulse generator 212 for generating a pulse signal by the output signal of the input unit 211, a second pulse generator 213 for generating a pulse by inputting a disable control signal dlclk_dis, an output unit for outputting a notifying signal dly_1clkz, which notifies the write operation, in response to the output signal of the first and second pulse generators 212 and 213 and a latch unit 215 for latching the output signal of the output unit 214.

Figure 12:
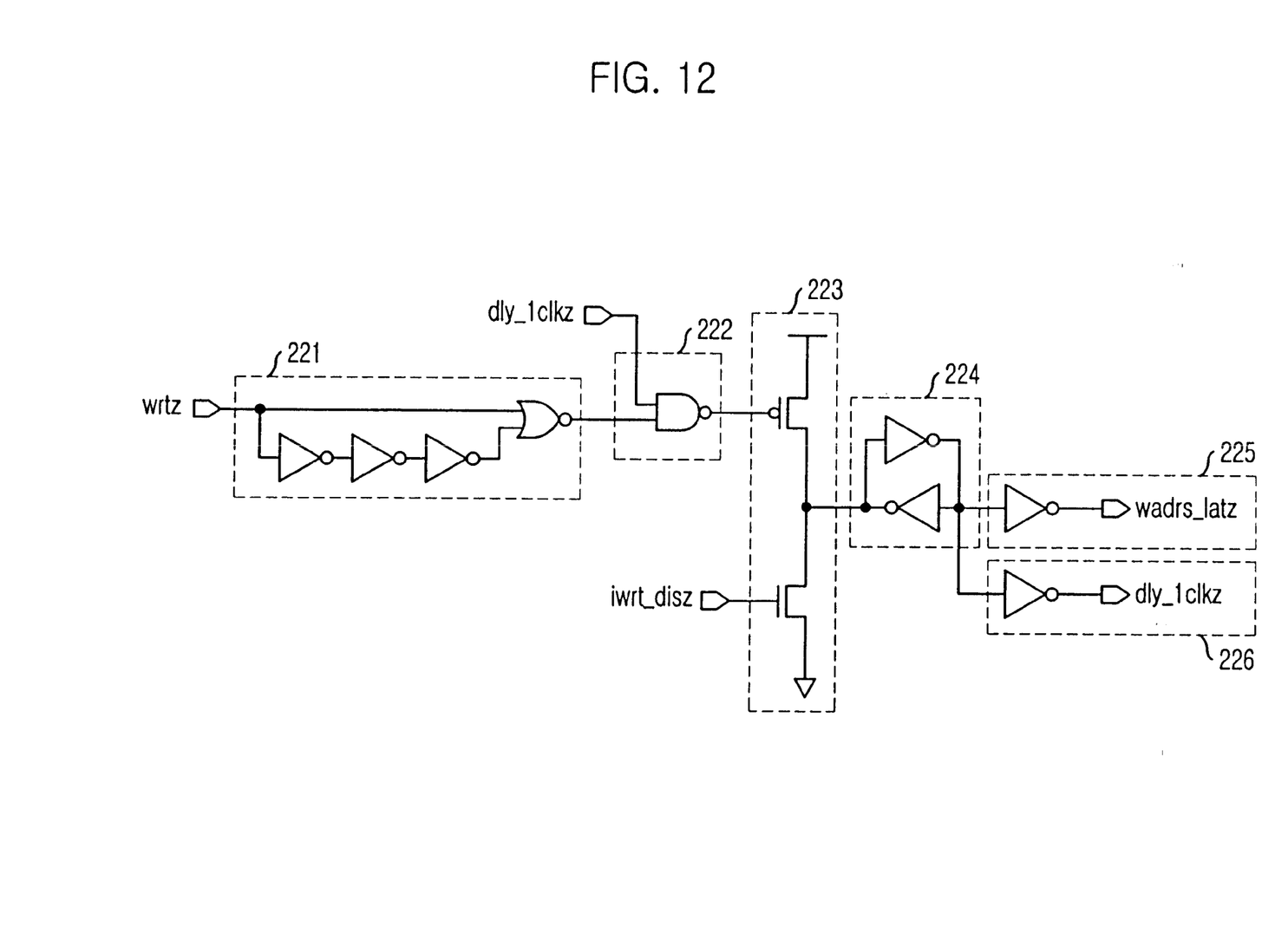
FIG. 12 is a detailed circuit diagram of the write latch controller 220.

FIG. 12 is a detailed circuit diagram of the write latch controller 220. In FIG. 12, the write latch controller 220 includes an input unit 221 for inputting the write enable buffer signal wrtz, a decoder 222 for decoding the output signal of the input unit 221 and the output signal dly__1clkz of the delay signal driver 210, an output unit 223 for driving the write latch control signal in response to the output signal of the decoder 222 and the input signal of a write disable signal iwrt$_{13}$ dispz, a latch unit 224 for latching the output signal of the output unit 223, an output unit 225 for outputting the write address latch control signal wadrs__latz from the latched output signal and an output unit 226 for outputting the write data latch control signal wdata__latz. However, the write latch control signal is made up of the write address latch control signal wadrs__latz and the write data latch control signal wdata__latz.

Figure 13:
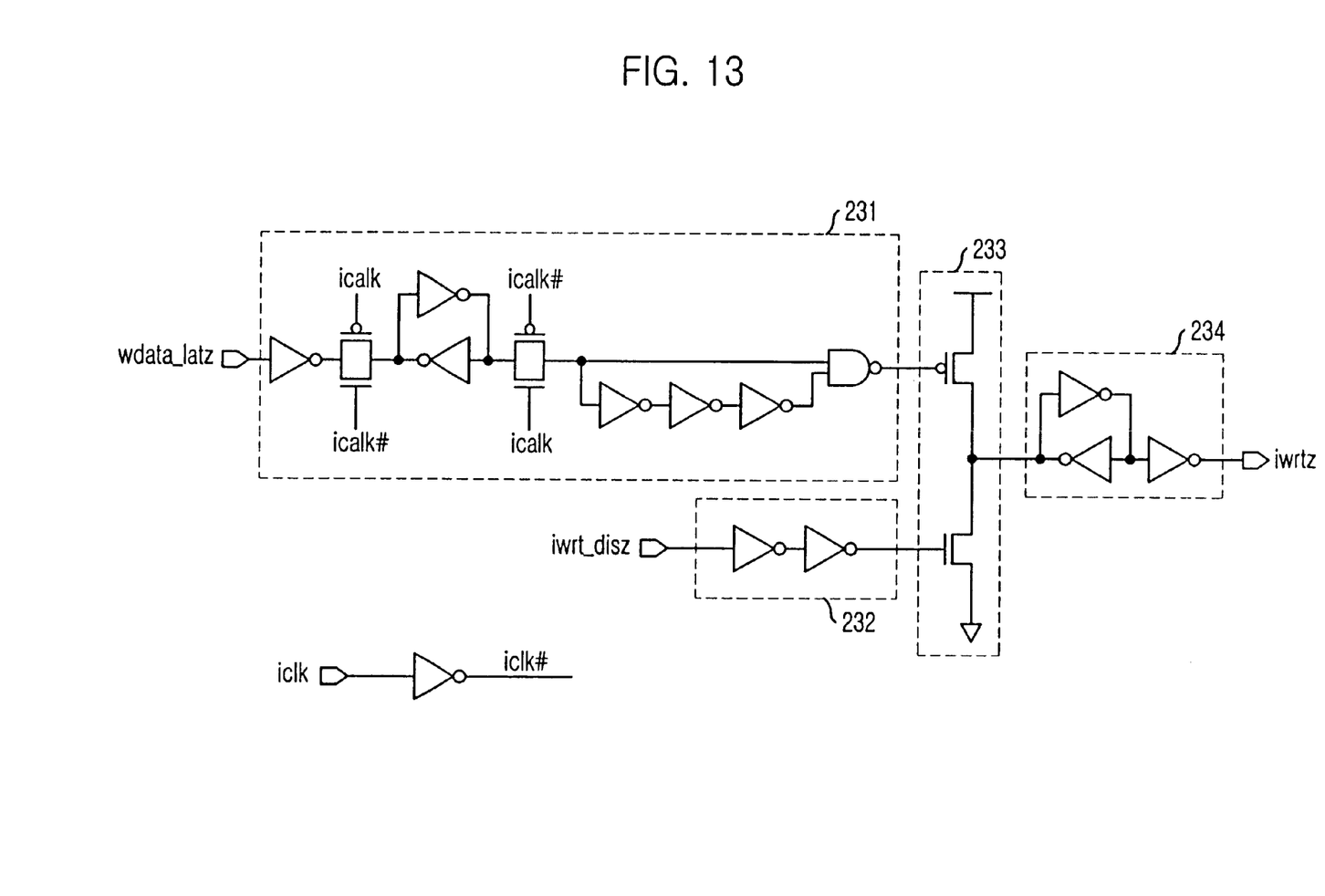
FIG. 13 is a detailed circuit diagram of the write signal generator 230.

FIG. 13 is a detailed circuit diagram of the write signal generator 230. In FIG. 13, the write signal generator 230 includes a first input unit 231 for outputting a pulse signal by the write data latch control signal wdata$_{13}$ latz outputted from the write latch controller 220 responding to the input signal of the internal clock iclk, a second input unit 232 for inputting the write disable signal iwrt__dispz, an output unit 233 for outputting the write signal iwrtz in response to the output signal from the first and second input units 231 and 232 and a latch unit 234 for latching the write signal iwrtz outputted from the output unit 233.

Figure 14:
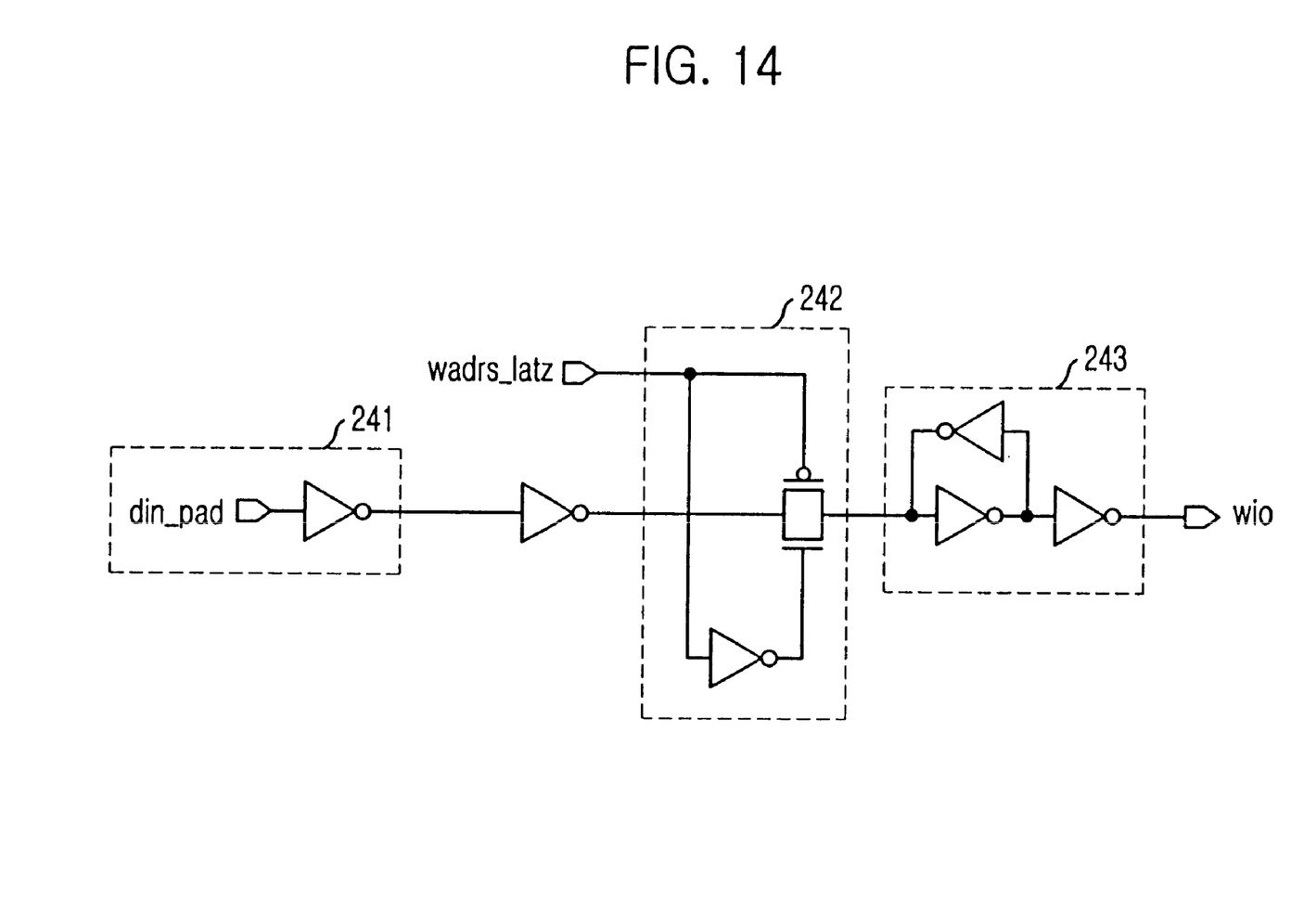
FIG. 14 is a detailed circuit diagram of the data input buffer 260A.

FIG. 14 is a detailed circuit diagram of the data input buffer 260A. In FIG. 14, the data input buffer 260A includes an input unit 241 for inputting the data signal applied from a data input pad din__pad, a switch 242 for sending the output data of the input unit 241 by responding the input signal of the write data latch control signal wdata__latz and an output unit 243 for latching and outputting the output signal of the switch 242.

Figure 15:
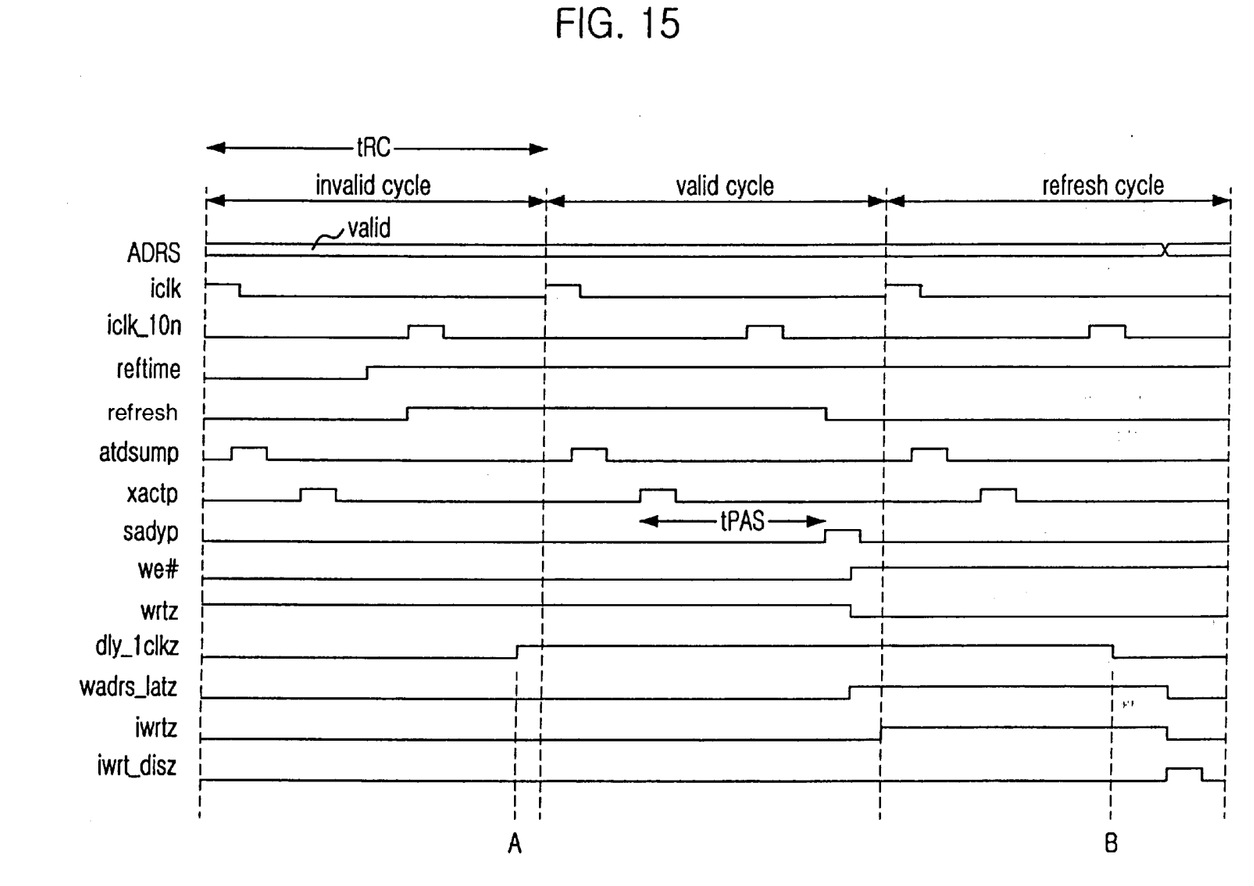
FIG. 15 is a timing chart for the operation of another embodiment of the present invention.

FIG. 15 is a timing chart for the operation of another embodiment of the present invention. The general operations of the peripherals are pretty much the same as the first embodiment of the present invention.

Hereinafter, the process for the refresh and the write operation of the present invention will be described. In the present invention, if the refresh is inputted during the write cycle, the refresh is operated. However, if the write is operated because the write cycle is terminated during the refresh, the address and the data for writing is temporarily stored in the latch and the write cycle is operated internally after the refresh. By processing this method, the problem of the prior art is solved.

For example, let the output signal reftime for notifying the refresh time is generated from the refresh timer 120. The output signal reftime is synchronized with iclk-10n and the refresh signal refresh from the refresh signal generator 130 is generated to refresh during the next cycle. When the refresh signal refresh is enabled, the state of the signal can be confirmed that it is a write state. If it is a write state, the output signal dly__1clkz is generated. Also, if the write cycle is terminated during the time between A-B sections in FIG. 15, the write operation cannot be operated immediately. During the time between A-B sections, a row address is enabled in the refresh cycle and the next cycle. The output signal dly__1clkz is enabled during this time and the write latch control signals wadrs__latz and wadta__latz are generated when the write cycle is completed in FIG. 12. The signal wadrs__latz is transmitted to the address buffer 160 to store the external address and the signal wdata__latz is transmitted to the write signal generator 230 to store the external data. When the signal wdata__latz is enabled to logic 'high', the internal clock iclk is synchronized with the signal wdata__latz and the write operation is automatically operated internally using the stored address and data during the next clock in FIG. 13. The write signal iwrtz is automatically terminated when the internal write operation is terminated after certain period of time.

By using this method, an ordinary specification can be used because all the operations are operated internally.

In the present invention, the refresh can be operated by synchronizing the signal from the refresh timer to the internal clock. Furthermore, the refresh is operated during the write operation when the refresh time is on. Also, if the write command for writing the data into the cell is entered from the external circuit, the address and the data is stored into the internal circuit and the stored data is written into the place where the address indicates by operating the internal write into the next cycle.

In the present invention, the method for the refresh and the write operation is very effective and simple. Furthermore, this method can solve the problems of the prior art.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. An apparatus for a refresh and a data input device in a static random access memory (SRAM) having a storage capacitor cell, comprising:

an internal clock generating means for generating and outputting two internal clock signals having a certain time difference of each other;

a refresh timer for generating and outputting an output signal to notify a refresh time;

a refresh signal generating means for generating a refresh signal in response to a faster signal of the two internal signals and the output signal from the refresh timer;

a refresh counter for generating refresh addresses during the refresh; and a column path control means for controlling the activation of a column path in response to a row active signal and the refresh signal.

2. The apparatus as recited in claim 1, further comprising:

a write enable buffer means for inputting a write enable signal;

a delay signal drive means for driving a delayed clock by inputting the refresh signal outputted from a refresh circuit and a write enable buffer signal;

a write latch control means for outputting a write latch control signal in response to the delayed clock from the delay signal drive means; and an address buffer means for selectively buffering internal addresses outputted from the external addresses or the refresh counter synchronized by a clock edge of the internal clock signal.

3. The apparatus as recited in claim 2, wherein the internal clock generating means includes:

an oscillator for outputting a signal having a certain period of time;

a pulse generate means for generating the internal clock signal in response to the output signal of the oscillator; and a delay means for outputting the internal clock signal by delaying for a certain period of time.

4. The apparatus as recited in claim 2, wherein the refresh signal generate means includes:
- a refresh terminating signal input means for inputting a refresh terminating signal;
- a refresh timer signal input means for inputting the output signal from the refresh timer;
- an output means for outputting a refresh drive signal in response to input signals from the refresh terminating signal input means and the refresh timer signal input means;
- a decode means for inputting and decoding the refresh drive signal and the faster internal clock signal;
- a refresh request signal generating means for generating a refresh request signal by inputting an output signal from the decode means; and
- a refresh signal output means for outputting a refresh signal in response to an output signal of the refresh request signal generating means and the refresh terminating signal input means.

5. The apparatus as recited in claim 2, wherein the column path control means includes:
- a decode means for inputting the row active signal and the refresh signal;
- a delay means for delaying an output signal of the decode means to guarantee tRCD; and
- an output means for generating a column path control signal using an output signal from the delay means.

6. The apparatus as recited in claim 2, wherein the address buffer includes:
- an external address latch means for latching and outputting a transmission of an external address in response to a write latch control signal;
- an input buffer means for selectively buffering the internal addresses applied from the refresh counter in response to the refresh signal;
- a latch means for latching buffered input addresses by changing the internal clock signal into a strobe signal; and
- an output buffer means for outputting the output signal of an address by buffering an output signal from the latch means.

7. The apparatus as recited in claim 2, wherein the delay signal drive means includes:
- an input means for inputting the refresh signal and the write enable buffer signal;
- a first pulse generating means for generating a pulse signal by an output signal from the input means;
- a second pulse generate means for generating a pulse by inputting a disable control signal;
- an output means for outputting a notifying signal, which notifies a write operation, in response to output signals from the first pulse generate means and the second pulse generating means; and
- a latch means for latching an output signal of the output means.

8. The apparatus as recited in claim 2, wherein the write latch control means includes:
- an input means for inputting the write enable buffer signal;
- a decode means for decoding an output signal from the input means and an output signal from the delay signal drive means;
- an output means for driving the write latch control signal in response to an output signal from the decode means and a write disable signal;
- a latch means for latching an output signal from the output means;
- an output means for outputting a write address latch control signal from a latched output signal; and
- an output means for outputting a write data latch control signal.

9. The apparatus as recited in claim 2, further comprising a write signal generating means for generating a write signal, which controls a write operation in response to the internal clock and a write data latch control signal.

10. The apparatus as recited in claim 9, wherein the write signal generate means includes:
- a first input means for outputting the write data latch control signal, which is an output signal of the write latch control means, to a pulse signal in response to the input signal of the internal clock;
- a second input means for inputting a write disable signal; and
- an output means for outputting the write signal in response to output signals of the first input means and the second input means.

11. The apparatus as recited in claim 9, further comprising a write drive means for driving a write data in response to an input of the write signal of the write signal generate means.

12. The apparatus as recited in claim 9, further comprising a data input buffer means for driving the data input in response to the write data latch control signal of the write latch control means.

13. The apparatus as recited in claim 12, wherein the data input buffer means includes:
- an input means for inputting the data signal applied from the chip of the pad;
- a switching means for sending the output data of the input means by responding the input signal of the write data latch control signal; and
- an output means for latching and outputting an output signal of the switching means.

14. A method for the a refresh and the a data input device in a static random access memory (SRAM) having a storage capacitor cell, comprising the steps of:
- a) generating two internal clocks having a certain time difference of each other;
- b) using a delayed signal of the two internal clocks as a strobe signal of an address;
- c) inputting an output signal from a refresh timer and generating a refresh signal in response to the faster signal of the two internal clocks; and
- d) selecting one of addresses, which are an external address and an internal address, for using a refresh signal.

15. The method as recited in claim 14, further comprising the step of controlling an activation of a column path using the refresh signal.

16. A method for a refresh and the a data input device in a static random access memory (SRAM) having a storage capacitor cell, comprising the steps of:
- a) disabling an address when a refresh signal is enabled during a write operation;
- b) confirming a current state if it is the write operation when the refresh begins;
- c) generating a delay signal for notifying the refresh if it is the write operation after the step b);
- d) generating a write address and a latch signal of the data when the delay signal is generated;

e) controlling an external input path of an address buffer using a write latch signal;

f) latching an external address after the step e); and g) buffering the latched address after the refresh.

17. A method for a refresh and a data input device in a static random access memory (SRAM) having a storage capacitor cell, comprising the steps of:

a) disabling an address when a refresh signal is enabled during a write operation;

b) confirming a current state if it is the write operation when the refresh begins;

c) generating a delay signal for notifying the refresh if it is the write operation after the step b);

d) generating a write address and a latch signal of the data when the delay signal is generated;

e) controlling a write driver using a write latch signal;

f) latching an external address after the step e); and g) buffering the latched address after the refresh.

* * * * *